(12) United States Patent
Nishikawa (10) Patent No.: US 11,503,722 B2
(45) Date of Patent: Nov. 15, 2022

(54) ENCLOSURE FOR POWER SUPPLY CIRCUIT BOARD AND POWER SUPPLY UNIT

(71) Applicant: BROTHER KOGYO KABUSHIKI KAISHA, Nagoya (JP)

(72) Inventor: Yasuo Nishikawa, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 17/015,146

(22) Filed: Sep. 9, 2020

(65) Prior Publication Data
US 2021/0100111 A1  Apr. 1, 2021

(30) Foreign Application Priority Data

Sep. 30, 2019  (JP) .............................. JP2019-180195

(51) Int. Cl.
| | |
|---|---|
| *H05K 5/00* | (2006.01) |
| *H05K 5/02* | (2006.01) |
| *H05K 7/14* | (2006.01) |

(52) U.S. Cl.
CPC ......... *H05K 5/0008* (2013.01); *H05K 5/0204* (2013.01); *H05K 5/0247* (2013.01); *H05K 7/1417* (2013.01)

(58) Field of Classification Search
CPC .. H05K 5/0008; H05K 5/0204; H05K 5/0247; H05K 7/1417
See application file for complete search history.

(56) References Cited

U.S. PATENT DOCUMENTS

| | | | | |
|---|---|---|---|---|
| 5,124,888 A | * | 6/1992 | Suzuki ................... | H05B 41/02 361/740 |
| 7,239,519 B2 | * | 7/2007 | Guo ................... | H05K 7/20509 361/714 |
| 7,771,226 B2 | * | 8/2010 | Iwaasa ................. | H05K 5/0247 439/460 |
| 7,817,435 B2 | * | 10/2010 | Iwaasa ................. | H05K 5/0247 361/752 |
| 9,962,756 B2 | * | 5/2018 | Tang ..................... | G06F 1/1658 |

(Continued)

FOREIGN PATENT DOCUMENTS

| | | |
|---|---|---|
| JP | 2006-222304 A | 8/2006 |
| JP | 2019-062102 A | 4/2019 |

(Continued)

*Primary Examiner* — Abhishek M Rathod
*Assistant Examiner* — Keith DePew
(74) *Attorney, Agent, or Firm* — Scully, Scott, Murphy & Presser, P.C.

(57) ABSTRACT

An enclosure for a power supply circuit board includes a plurality of sheet metal members combined to accommodate a power supply circuit board. The plurality of sheet metal members includes a first sheet metal member. The first sheet metal member includes a main plate having a flat plate shape, and an inner extension connected to the main plate through a bent portion located at an end of the main plate. The inner extension includes a circuit board support for supporting the power supply circuit board. The circuit board support faces the main plate and is separated from the main plate in a direction perpendicular to the main plate. The circuit board support is located within an inner space surrounded by the plurality of sheet metal members.

13 Claims, 8 Drawing Sheets

(56) References Cited

U.S. PATENT DOCUMENTS

| | | | |
|---|---|---|---|
| 10,045,454 B2* | 8/2018 | Han | H05K 5/0013 |
| 10,888,008 B1* | 1/2021 | Lee | H05K 5/03 |
| 11,006,541 B2* | 5/2021 | Hatori | H05K 5/0013 |
| 2006/0109634 A1* | 5/2006 | Lee | H05K 7/20518 |
| | | | 361/720 |
| 2007/0070606 A1* | 3/2007 | Guo | H05K 9/005 |
| | | | 361/714 |
| 2008/0101009 A1* | 5/2008 | Iwaasa | H05K 5/0247 |
| | | | 361/679.01 |
| 2009/0017672 A1* | 1/2009 | Iwaasa | H05K 5/0247 |
| | | | 439/460 |
| 2009/0147450 A1* | 6/2009 | Nara | G06F 1/181 |
| | | | 361/679.01 |
| 2016/0044799 A1* | 2/2016 | Igari | H05K 5/0052 |
| | | | 361/752 |
| 2018/0160558 A1* | 6/2018 | Han | H05K 7/1412 |
| 2019/0327847 A1* | 10/2019 | Hatori | B21D 5/00 |
| 2021/0153362 A1* | 5/2021 | Sumida | H05K 7/142 |

FOREIGN PATENT DOCUMENTS

| | | | |
|---|---|---|---|
| JP | 2019062102 A | * | 4/2019 |
| JP | 2019-091833 A | | 6/2019 |

\* cited by examiner

ENCLOSURE FOR POWER SUPPLY CIRCUIT BOARD AND POWER SUPPLY UNIT

CROSS REFERENCE TO RELATED APPLICATIONS

This application claims priority from Japanese Patent Application No. 2019-180195 filed Sep. 30, 2019. The entire content of the priority application is incorporated herein by reference.

TECHNICAL FIELD

This disclosure relates to an enclosure for a power supply circuit board configured by combining a plurality of sheet metal members so as to accommodate a power supply circuit board and also relates to a power supply unit.

BACKGROUND

A disclosed enclosure for a power supply circuit board is configured by combining two sheet metal members so as to accommodate a power supply circuit board on which a plurality of electronic parts including a power supply circuit are mounted.

SUMMARY

According to one aspect, this specification discloses an enclosure for a power supply circuit board. The enclosure includes a plurality of sheet metal members combined to accommodate a power supply circuit board. The plurality of sheet metal members includes a first sheet metal member. The first sheet metal member includes a main plate having a flat plate shape, and an inner extension connected to the main plate through a bent portion located at an end of the main plate. The inner extension includes a circuit board support for supporting the power supply circuit board. The circuit board support faces the main plate and is separated from the main plate in a direction perpendicular to the main plate. The circuit board support is located within an inner space surrounded by the plurality of sheet metal members.

According to another aspect, this specification also discloses a power supply unit. The power supply unit includes an enclosure for a power supply circuit board, and a support tray. The enclosure includes a first sheet metal member and a second sheet metal member combined to form an inner space accommodating a power supply circuit board. The first sheet metal member includes a main plate, an inner extension, and a bottom plate. The main plate has a flat plate shape. The inner extension is connected to the main plate through a bent portion located at an end of the main plate. The inner extension includes a circuit board support for supporting the power supply circuit board. The circuit board support faces the main plate and is separated from the main plate in a direction perpendicular to the main plate. The circuit board support is located within the inner space formed by the first sheet metal member and the second sheet metal member. The bottom plate is connected to the main plate through another bent portion located at another end of the main plate. The second sheet metal member includes a facing plate, a top plate, and two side plates. The facing plate is located in parallel with the main plate. The top plate is connected to the facing plate. Each of the two side plates is connected to the facing plate and the top plate. The support tray supports the enclosure in a state where the support tray is in contact with the bottom plate. The support tray includes a pressing portion configured to press at least one of the two side plates from an outer side toward an inner side.

BRIEF DESCRIPTION OF THE DRAWINGS

Embodiments in accordance with this disclosure will be described in detail with reference to the following figures wherein.

DETAILED DESCRIPTION

In the above-mentioned enclosure for the power supply circuit board, an inner extension for attaching the power supply circuit board is formed by bending a facing region of one sheet metal member facing the power supply circuit board. Thus, a gap is formed between the inner extension and the main part of the sheet metal member. A gap filling member is provided in the gap. Since the gap filling member is made of a material different from the sheet metal member and is made of a flame-retardant resin material, there is a problem that the manufacturing cost of the enclosure for the power supply circuit board increases.

In view of the foregoing, an example of an object of the present disclosure is to provide an enclosure for a power supply circuit board and a power supply unit capable of suppressing an increase in the manufacturing cost.

Hereinafter, a power supply unit according to an embodiment of the present disclosure will be described. As shown in FIGS. 1 to 4, a power supply unit 1 includes an enclosure for a power supply circuit board 2 formed by mainly combining two sheet metal members 10 and 20 so as to accommodate a power supply circuit board 100 (see FIGS. 3 and 4) and a support tray (support plate) 3 that supports the enclosure 2. In the present embodiment, a description will be given below with reference to a vertical direction Z, a front-rear direction Y perpendicular to the vertical direction Z, and a left-right direction X perpendicular to the vertical direction Z and the front-rear direction Y shown in FIG. 1. The installation direction of the power supply unit 1 or the enclosure for the power supply circuit board 2 may be changed as appropriate and is not particularly limited.

Figure 1:
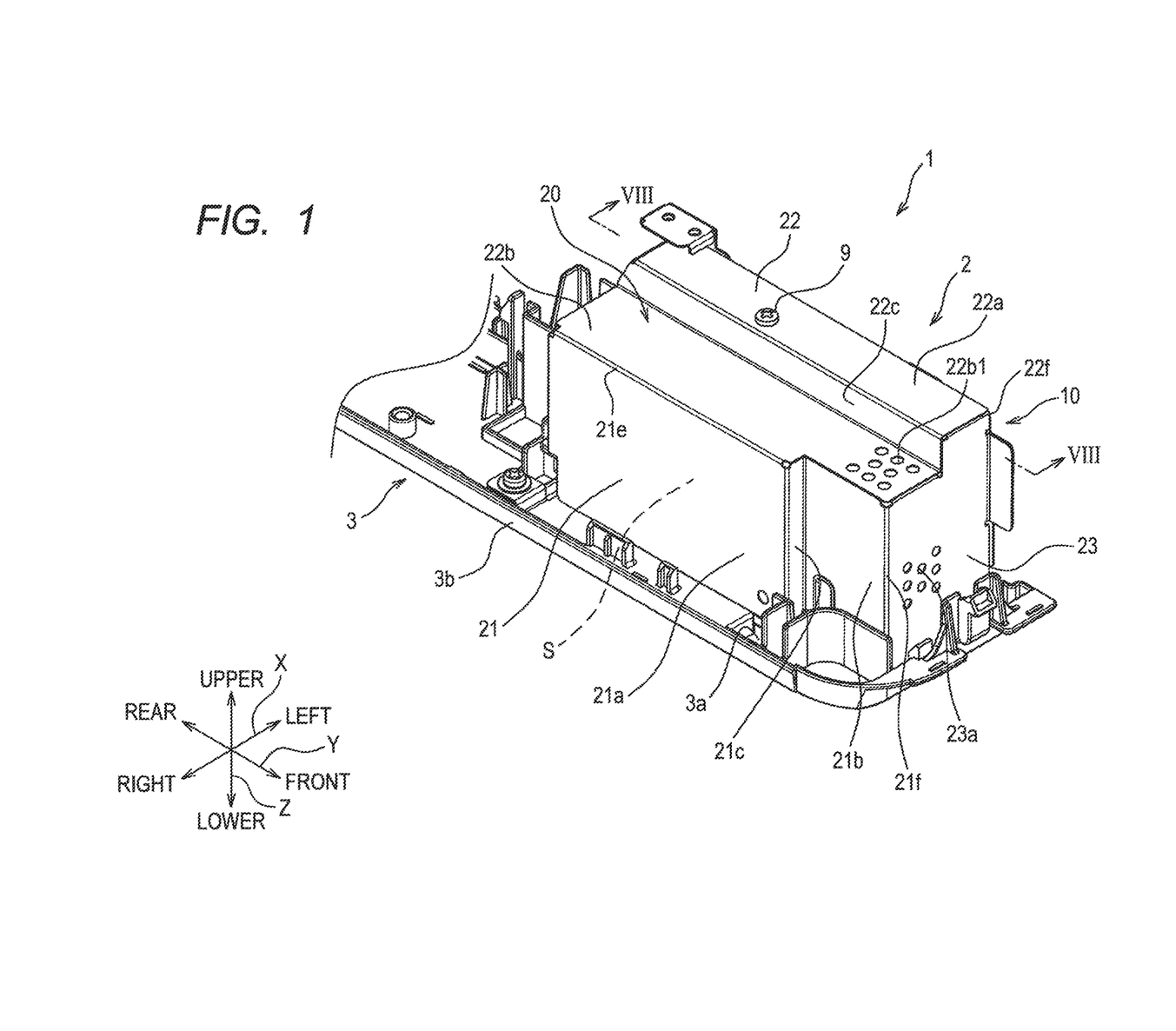
FIG. 1 is a perspective view of a power supply unit according to an embodiment of this disclosure.
Figure 3:
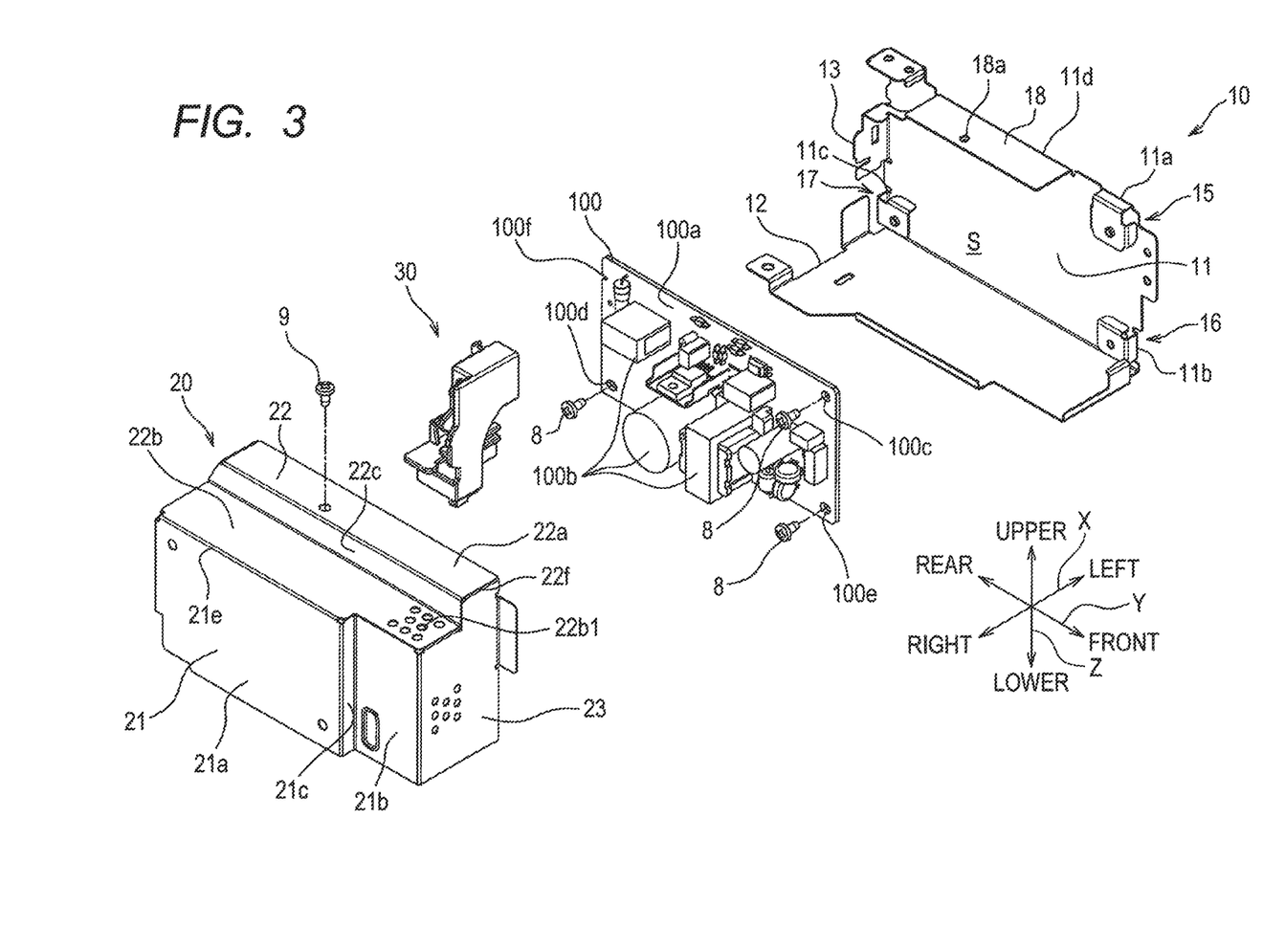
FIG. 3 is an exploded perspective view of the enclosure for the power supply circuit board shown in FIG. 1.
Figure 4:
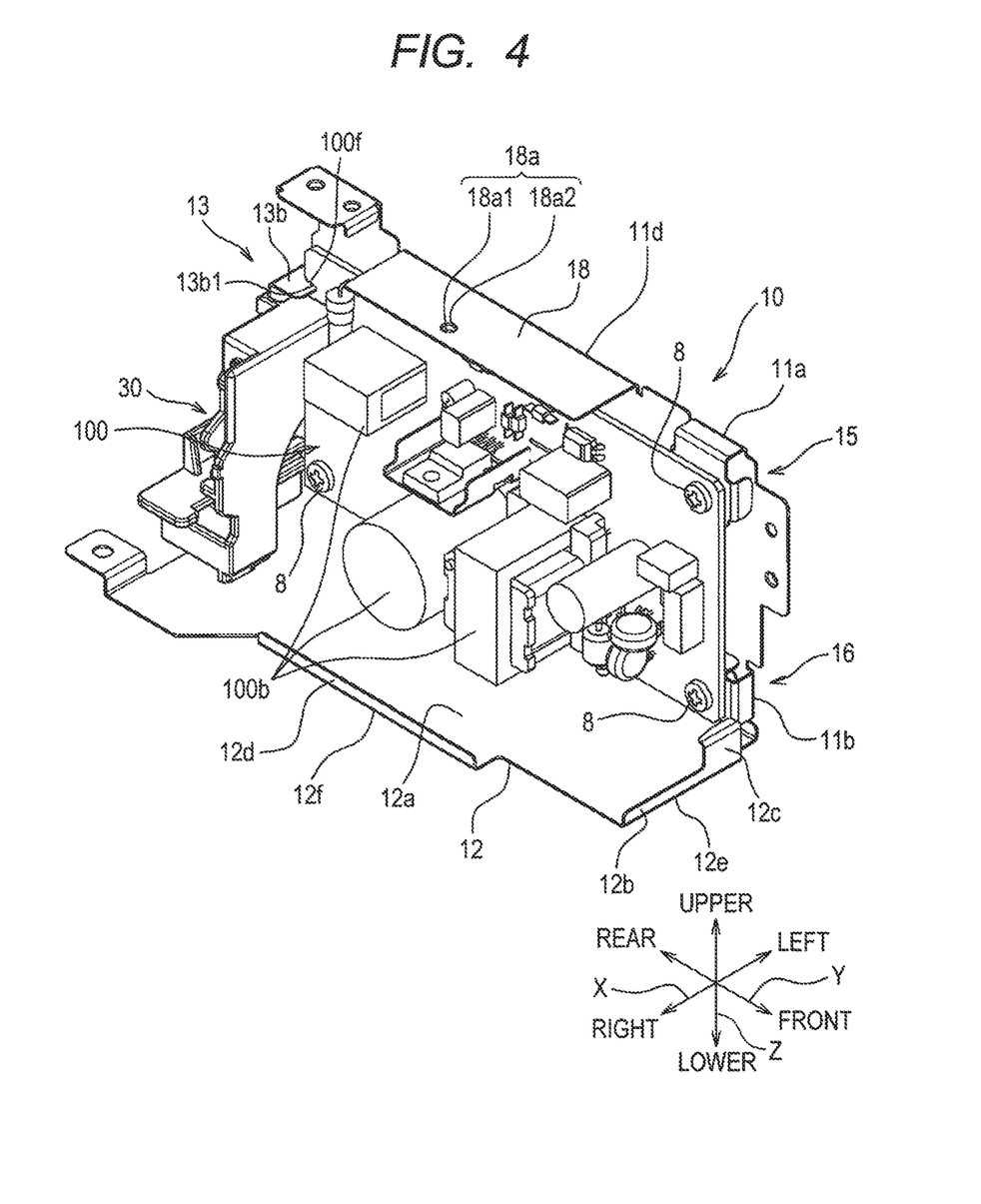
FIG. 4 is a perspective view showing a state where a power supply circuit board is fixed to a sheet metal member.

As shown in FIG. 1, an inner space S surrounded by the two sheet metal members 10 and 20 is formed in the enclosure 2. The power supply circuit board 100 is disposed in the inner space S. As shown in FIGS. 3 and 4, the power supply circuit board 100 has a plurality of electronic components 100b including a power supply circuit mounted on a surface 100a facing the sheet metal member 20, and the periphery of the power supply circuit board 100 is surrounded by the enclosure 2 so that particular fireproofing standards are met. Holes 100c and 100e are formed in two front corners of the power supply circuit board 100, and a hole 100d is formed in the rear lower corner thereof. Screws 8 are passed through these three holes 100c to 100e whereby the power supply circuit board 100 is fixed to the sheet metal member 10. A slit 100f is formed in the rear upper corner of the power supply circuit board 100.

Figure 2A:
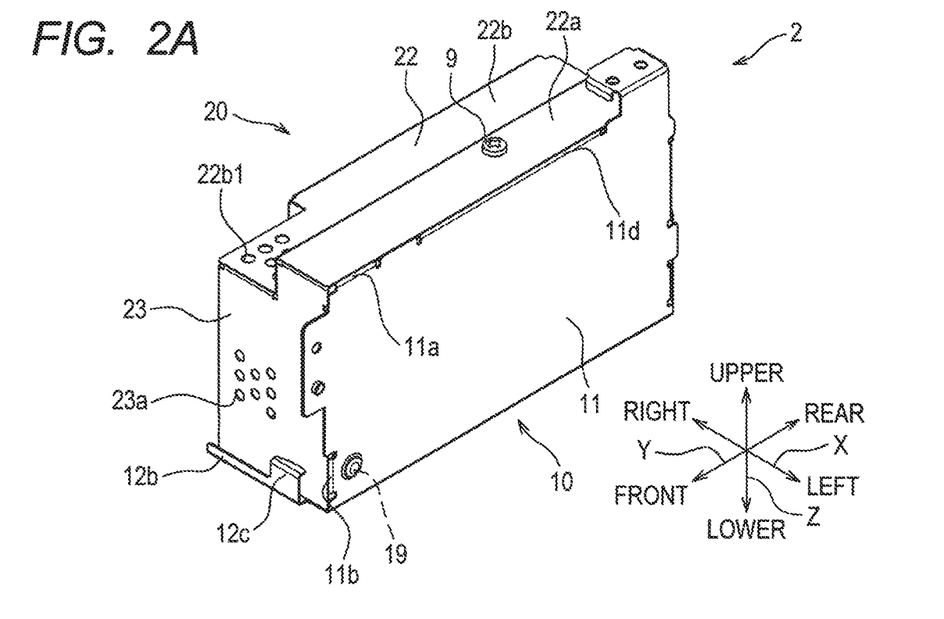
FIG. 2A is a perspective view of an enclosure for a power supply circuit board shown in FIG. 1, as viewed from the front left diagonally above.
Figure 2B:
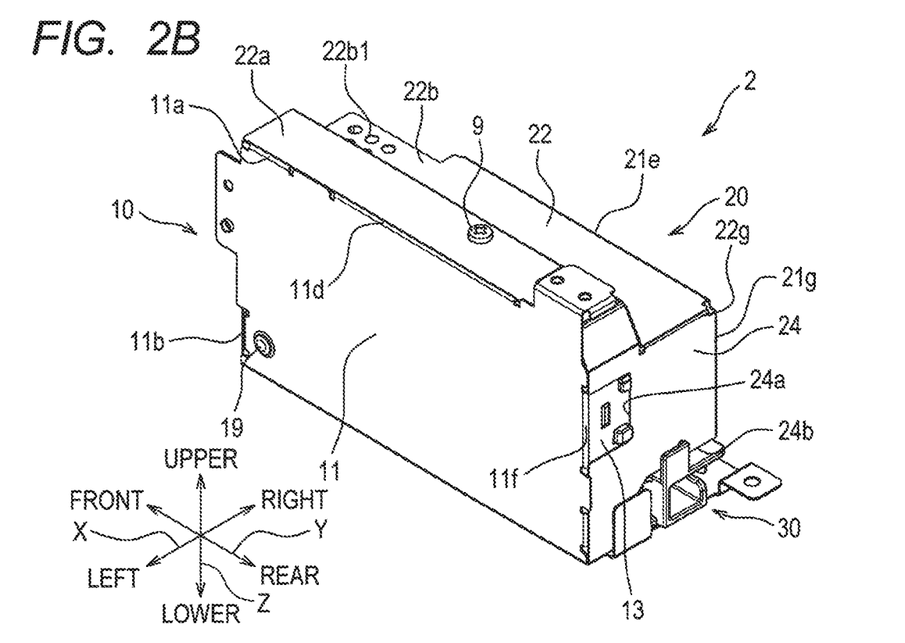
FIG. 2B is a perspective view of the enclosure for the power supply circuit board shown in FIG. 1, as viewed from the rear left diagonally above.
Figure 5:
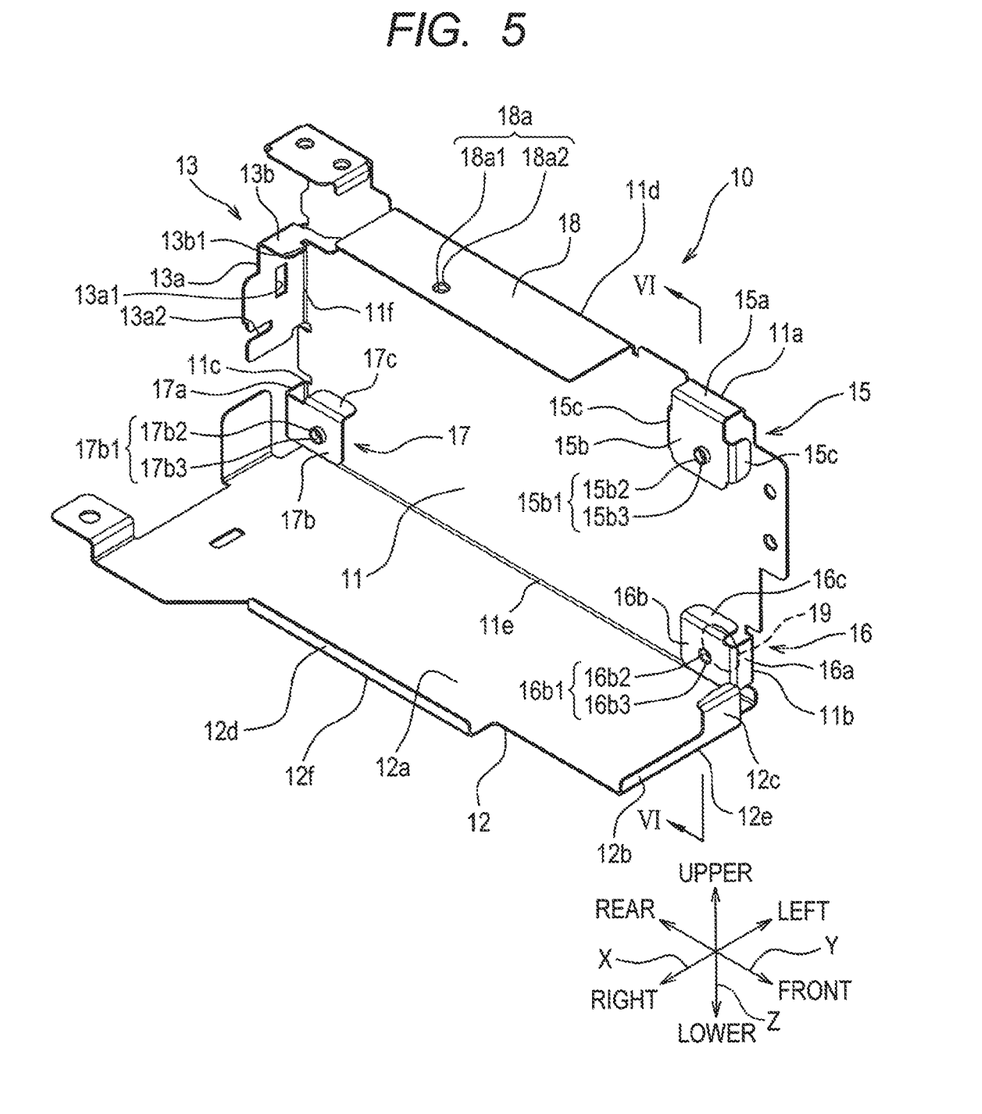
FIG. 5 is a perspective view showing the sheet metal member shown in FIG. 4 in a state where the power supply circuit board and a gap filling member are removed.

As shown in FIGS. 2A and 2B and FIG. 5, one sheet metal member 10 (a first sheet metal member) among the two sheet metal members 10 and 20 includes a substantially rectangular planar main body portion (main plate) 11 extending in the vertical direction Z and the front-rear direction Y, a planar bottom portion (bottom plate) 12 extending in the front-rear direction Y and the left-right direction X from the lower end of the main body portion 11, and a planar rear portion 13 extending in the vertical direction Z and the left-right direction X from the rear end of the main body portion 11. In the present embodiment, the main body portion 11, the bottom portion 12, and the rear portion 13 of the sheet metal member 10 are formed of one metal plate using sheet metal. However, a plurality of metal plates may be connected to form one sheet metal member 10.

As shown in FIG. 5, three inner extensions (inner extension protrusions) 15 to 17 are connected to the main body portion 11 through bent portions 11a to 11c at the ends of the main body portion 11. The inner extensions 15 to 17 are disposed to be separated from each other as an attachment portion for attaching the power supply circuit board 100 to the main body portion 11. The inner extension 15 is disposed in the front upper corner of the main body portion 11. The inner extension 15 includes a horizontal portion 15a extending rightward from the bent portion 11a and a vertical portion 15b extending downward from the right end of the horizontal portion 15a. The horizontal portion 15a (an example of a first extension portion) is bent toward the inner space S at a right angle relative to the main body portion 11. The vertical portion 15b (an example of a second extension portion) is bent at a right angle relative to the horizontal portion 15a so as to face the main body portion 11. The vertical portion 15b serves as a circuit board support for fixing the power supply circuit board 100 with screws. The horizontal portion 15a has a length (width) for separating the main body portion 11 and the power supply circuit board 100 by a particular distance in a state where the power supply circuit board 100 is attached to the vertical portion 15b. The particular distance is the shortest separation distance capable of preventing the growth of a whisker that causes a short circuit between the power supply circuit board 100 and the main body portion 11. In this way, it is possible to prevent the power supply circuit board 100 and the main body portion 11 from being electrically connected and short-circuited while suppressing the enclosure 2 from becoming large in the left-right direction X. Since the separation distance between the main body portion 11 and the power supply circuit board 100 is relatively small, a screw and so on may not easily enter the space therebetween. In this way, it is possible to prevent the power supply circuit board 100 and the main body portion 11 from being short-circuited by a screw. Two reinforcement pieces 15c for reinforcing the vertical portion 15b are formed at the front and rear ends of the vertical portion 15b. Each reinforcement piece 15c is bent at a right angle relative to the vertical portion 15b so as to protrude toward the main body portion 11. A screw hole 15b1 penetrating in the left-right direction X is formed in the vertical portion 15b. The screw hole 15b1 includes a hole portion 15b2 protruding rightward from the vertical portion 15b and an internal thread 15b3 formed on an inner circumferential surface of the hole portion 15b2.

The inner extension 16 is disposed in the front lower corner of the main body portion 11. The inner extension 16 includes a vertical portion 16a extending rightward from the bent portion 11b and a vertical portion 16b extending rearward from the right end of the vertical portion 16a. The vertical portion 16b serves as a circuit board support for fixing the power supply circuit board 100 with screws. The vertical portion 16a has a length (width) for separating the main body portion 11 and the power supply circuit board 100 by a particular distance in a state where the power supply circuit board 100 is attached to the vertical portion 16b similarly to the horizontal portion 15a. A reinforcement piece 16c for reinforcing the vertical portion 16b is formed at the upper end of the vertical portion 16b. A screw hole 16b1 penetrating in the left-right direction X is formed in the vertical portion 16b. The screw hole 16b1 includes a hole portion 16b2 protruding toward the main body portion 11 from the vertical portion 16b and an internal thread 16b3 formed on an inner circumferential surface of the hole portion 16b2.

Figure 6:
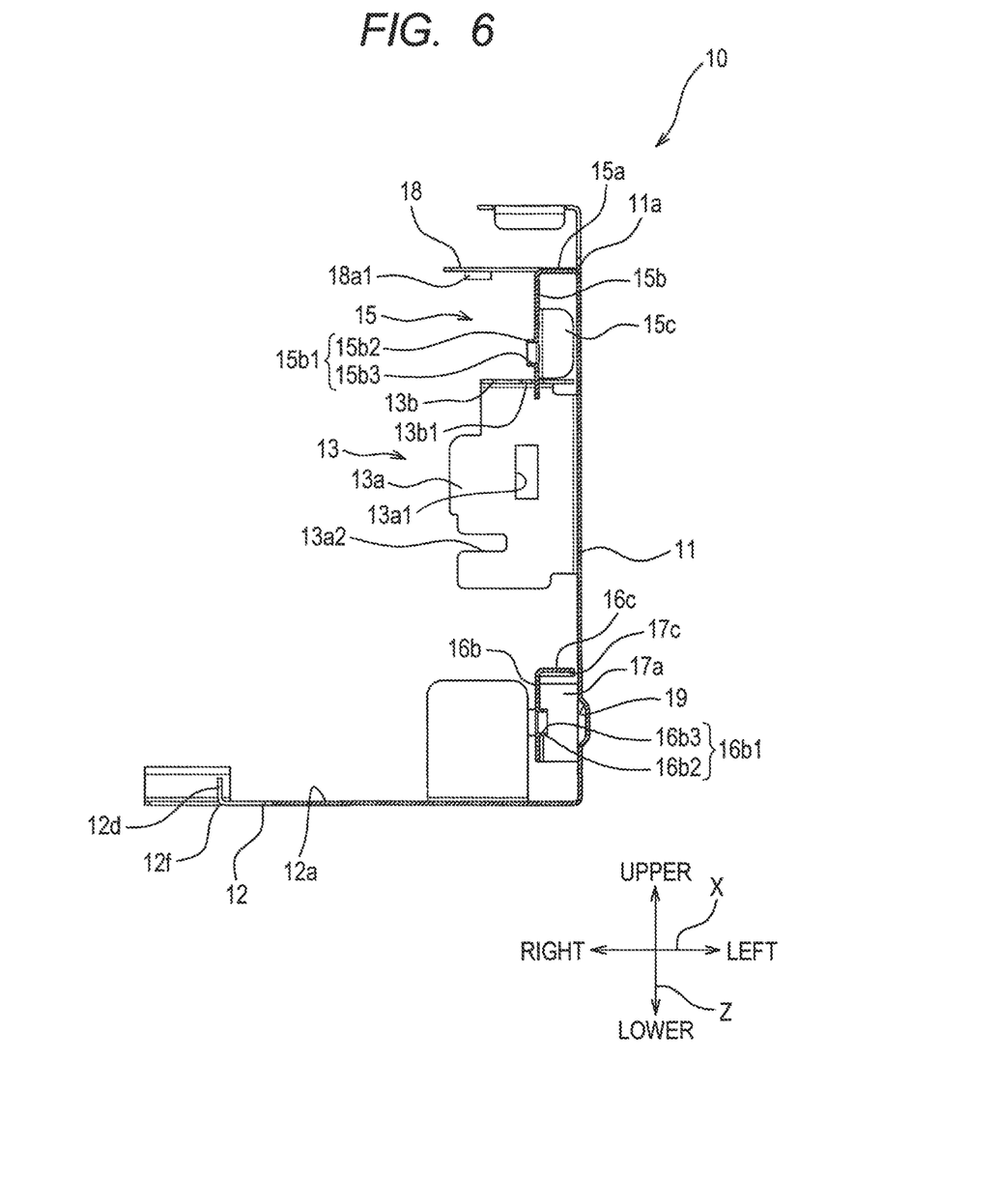
FIG. 6 is a cross-sectional view along a line VI-VI shown in FIG. 5.

As shown in FIGS. 5 and 6, the main body portion 11 has a concave portion 19 opened toward the vertical portion 16b. The concave portion 19 is formed at a position facing the vertical portion 16b of the main body portion 11 and faces the entirety of the screw hole 16b1. That is, the concave portion 19 is formed such that a portion of the main body portion 11 facing the entirety of the screw hole 16b1 is depressed. Since the concave portion 19 is formed in the main body portion 11, as shown in FIG. 6, even when the separation distance between the vertical portion 16b and the main body portion 11 is small, the distance between the hole portion 16b2 and the bottom surface of the concave portion 19 increases due to the concave portion 19. Therefore, at the time of forming the internal thread 16b3 on the inner circumferential surface of the hole portion 16b2 by tapping, the tip of the tap does not make contact with the main body portion 11, and it is easy to form the internal thread. Since the hole portion 15b2 of the screw hole 15b1 protrudes rightward from the vertical portion 15b, a formation position of the internal thread 15b3 is away from the main body portion 11. Therefore, although a concave portion is not formed at the position facing the vertical portion 15b of the main body portion 11, the tip of the tap does not make contact with the main body portion 11 at the time of forming the internal thread 15b3.

The inner extension 17 is disposed in the rear lower corner of the main body portion 11. The inner extension 17 includes a vertical portion 17a extending rightward from the bent portion 11c and a vertical portion 17b extending forward from the right end of the vertical portion 17a. The vertical portion 17b serves as a circuit board support for fixing the power supply circuit board 100 with screws. The vertical portion 17a has a length (width) for separating the main body portion 11 and the power supply circuit board 100 by a particular distance in a state where the power supply circuit board 100 is attached to the vertical portion 17b similarly to the horizontal portion 15a. A reinforcement piece 17c for reinforcing the vertical portion 17b is formed at the upper end of the vertical portion 17b. A screw hole 17b1 penetrating in the left-right direction X is formed in the vertical portion 17b. The screw hole 17b1 includes a hole portion 17b2 protruding rightward from the vertical portion 17b and an internal thread 17b3 formed on an inner circumferential surface of the hole portion 17b2. Since the hole portion 17b2 of the screw hole 17b1 protrudes rightward from the vertical portion 17b, a formation position of the internal thread 17b3 is away from the main body portion 11. Therefore, although a concave portion is not formed at the position of the main body portion 11 facing the vertical portion 17b, the tip of the tap does not make contact with the main body portion 11 at the time of forming the internal thread 17b3.

As shown in FIG. 5, the sheet metal member 10 has a horizontal portion 18 connected to the main body portion 11 through a bent portion 11d located at an upper portion of the main body portion 11. The horizontal portion 18 extends long in the front-rear direction Y. A screw hole 18a penetrating in the vertical direction Z is formed in the horizontal portion 18. The screw hole 18a includes a hole portion 18a1 formed so as to protrude downward from the horizontal portion 18 and an internal thread 18a2 formed on an inner circumferential surface of the hole portion 18a1.

As shown in FIG. 5, the bottom portion 12 is connected through a bent portion 11e at the lower end of the main body portion 11. The bottom portion 12 has a bottom surface 12a which extends rightward from the bent portion 11e and on which the sheet metal member 20 stands. The vertical portion 12b extending in the left-right direction X is connected to the front end of the bottom portion 12 through a bent portion 12e. A pressing portion (pressing protrusion) 12c which extends upward and of which the upper end is bent rearward is formed in the vertical portion 12b. The pressing portion 12c is formed at the left end of the vertical portion 12b in the left-right direction X. Since the pressing portion 12c is formed in the bottom portion 12, as shown in FIG. 2A, when the two sheet metal members 10 and 20 are combined, the lower end of a side plate 23 (described later) of the sheet metal member 20 is pressed inward (rearward) from the outer side. In this way, outward displacement of the side plate 23 of the sheet metal member 20 is suppressed, and the occurrence of a gap exceeding particular fireproofing standards between the front end of the main body portion 11 of the sheet metal member 10 and the left end of the side plate 23 of the sheet metal member 20 can be prevented. The vertical portion 12d extending in the front-rear direction Y is connected to the right end of the bottom portion 12 through a bent portion 12f. When the sheet metal member 20 stands on the bottom surface 12a, the vertical portion 12d makes contact with the lower end of a facing plate 21 (described later) for positioning.

As shown in FIG. 5, the rear portion 13 is connected through a bent portion 11f at the rear end of the main body portion 11. The rear portion 13 includes a vertical flat surface portion 13a extending upward from the center of the rear end of the main body portion 11 in the vertical direction Z and a horizontal flat surface portion 13b extending forward from the upper end of the vertical flat surface portion 13a. A slit 13b1 configured to be fitted to the slit 100f of the power supply circuit board 100 is formed in the horizontal flat surface portion 13b. Due to this, as shown in FIG. 4, the power supply circuit board 100 is also supported by the rear portion 13. A through hole 13a1 and a slit 13a2 for fixing a gap filling member 30 (see FIGS. 2B, 3, and 4; described later) are formed in the vertical flat surface portion 13a.

As shown in FIGS. 1 to 3, the other sheet metal member 20 (another sheet metal member: a second sheet metal member) of the two sheet metal members 10 and 20 includes the facing plate 21 positioned in parallel to the main body portion 11 and facing the main body portion 11 in the left-right direction X, a top plate 22, and two side plates 23 and 24 all of which are formed of one metal plate using sheet metal. However, a plurality of metal plates may be connected to form one sheet metal member 20.

As shown in FIGS. 1 and 3, the facing plate 21 includes two vertical flat surface portions 21a and 21b extending in the vertical direction Z and the front-rear direction Y and a vertical flat surface portion 21c extending in the vertical direction Z and the left-right direction X. The vertical flat surface portion 21a is disposed at a farther position from the main body portion 11 than the vertical flat surface portion 21b is, and the two vertical flat surface portions 21a and 21b are connected by the vertical flat surface portion 21c. In this way, the facing plate 21 is bent in a stepwise shape in the front-rear direction Y.

As shown in FIGS. 1 and 3, the top plate 22 includes two horizontal flat surface portions 22a and 22b extending in the front-rear direction Y and the left-right direction X and a vertical flat surface portion 22c extending in the vertical direction Z and the front-rear direction Y. The horizontal flat surface portion 22a is disposed at a higher position than the horizontal flat surface portion 22b, and the two horizontal flat surface portions 22a and 22b are connected by the vertical flat surface portion 22c. In this way, the top plate 22b is bent in a stepwise shape in the left-right direction X. The right end (the right end of the horizontal flat surface portion 22b) of the top plate 22 is connected through a bent portion 21e at the upper end of the facing plate 21. As shown in FIG. 1, a hole (not shown) for inserting a screw 9 is formed in the horizontal flat surface portion 22a of the top plate 22 at a position facing the screw hole 18a when the two sheet metal members 10 and 20 are combined. Due to this, when the two sheet metal members 10 and 20 are combined, the two sheet metal members 10 and 20 is tightly fixed by fastening the screw 9 into the screw hole 18a. Therefore, the two sheet metal members 10 and 20 are not likely to slip and a gap is not likely to be formed between the both sheet metal members. A plurality of through holes 22b1 for heat dissipation are formed on the front side of the horizontal flat surface portion 22b of the top plate 22. These through holes 22b1 have a diameter that satisfies particular fireproofing standards.

As shown in FIG. 1 and FIGS. 2A and 2B, one side plate 23 of the two side plates 23 and 24 is disposed on the front side, the other side plate 24 is disposed on the rear side, and both side plates have a vertical flat surface extending in the vertical direction Z and the left-right direction X. The side plate 23 has an upper end connected through a bent portion 22f at the front end of the top plate 22 and has a right end connected through a bent portion 21f at the front end of the facing plate 21. A plurality of through holes 23a for heat dissipation are also formed on the side plate 23. These through holes 23a also have a diameter that satisfies particular fireproofing standards. The side plate 24 has an upper end connected through a bent portion 22g at the rear end of the top plate 22 and has a right end connected through a bent portion 21g at the rear end of the facing plate 21. As shown in FIG. 2B, the side plate 24 has two cutout portions 24a and 24b. The cutout portion 24a is formed at the left end of the side plate 24 at the center and slightly above the center in the vertical direction Z and is closed by the rear portion 13 when the two sheet metal members 10 and 20 are combined. The cutout portion 24b is formed to extend from the center of the lower end of the side plate 24 in the left-right direction X toward the right end and is closed by the gap filling member 30 described later.

The sheet metal member 20 includes the facing plate 21, the top plate 22, and the two side plates 23 and 24, and as shown in FIG. 3, is opened toward the lower and left sides to form the inner space S for accommodating the power supply circuit board 100 in cooperation with the sheet metal member 10.

As shown in FIGS. 2B and 3, the gap filling member 30 for filling the gap (the cutout portion 24b) between the side plate 24 and the bottom portion 12 is disposed in the inner space S. The gap filling member 30 of the present embodiment is formed of a flameproof resin material (a resin material satisfying the V-1 standard of the UL 94 standard, which is one of the flameproof standards). However, the gap filling member 30 may be formed of a resin material or a metal material having flameproof properties satisfying the V-0 or higher standard of the UL 94 standards.

Figure 7:
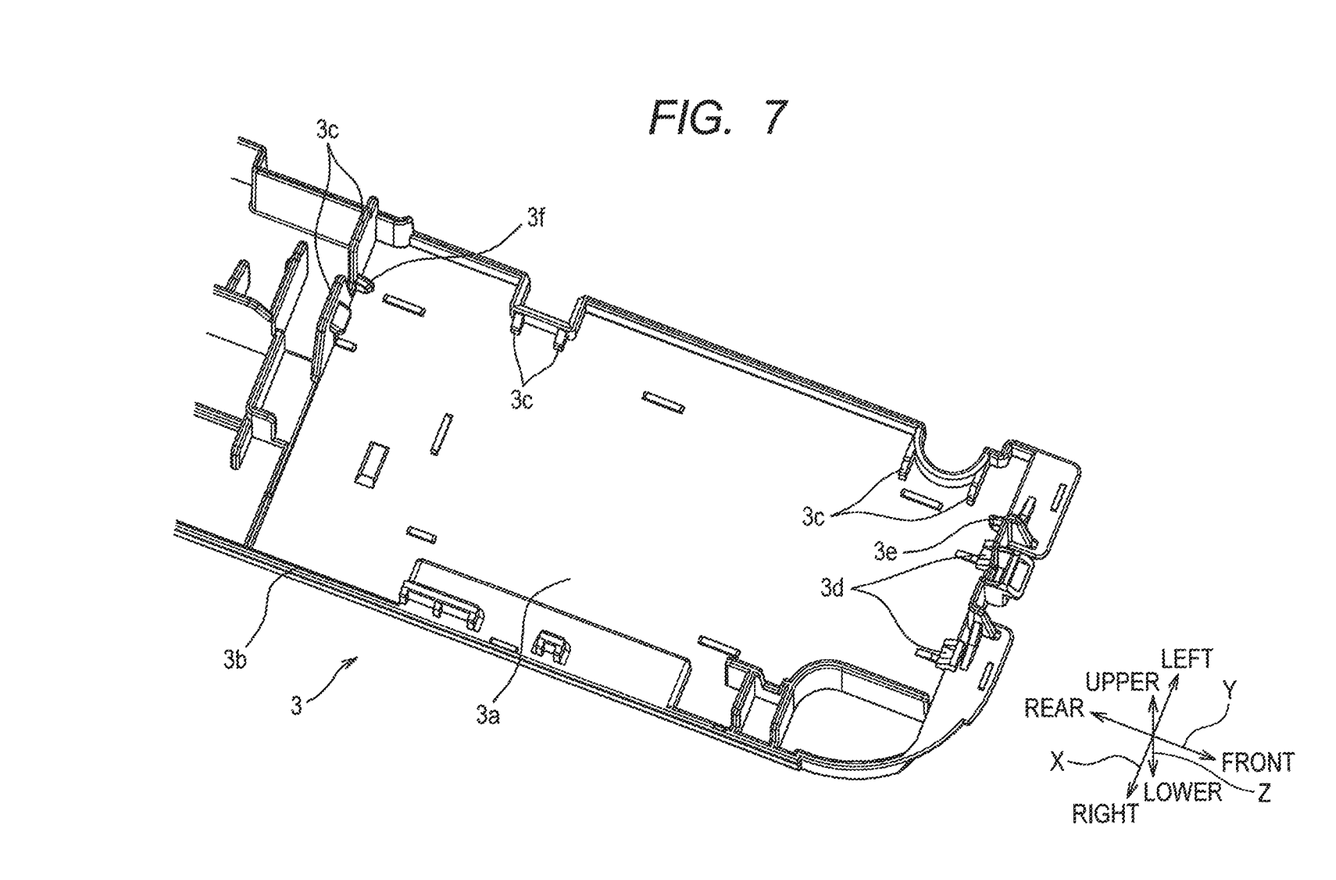
FIG. 7 is a perspective view showing a support tray shown in FIG. 1.

As shown in FIGS. 1 and 7, the support tray 3 includes a bottom plate 3a that supports the enclosure 2. A wall portion 3b standing in the vertical direction Z is formed on a peripheral edge of the bottom plate 3a. As shown in FIG. 7, a plurality of guide portions 3c standing in the vertical direction Z are formed on the bottom plate 3a. Two guide portions 3d are also formed on the wall portion 3b. These guide portions 3c and 3d are disposed so as to surround the periphery of the enclosure 2 disposed on the support tray 3 and are members that guide the enclosure 2 at the time when the enclosure 2 is placed on the support tray 3.

Figure 8:
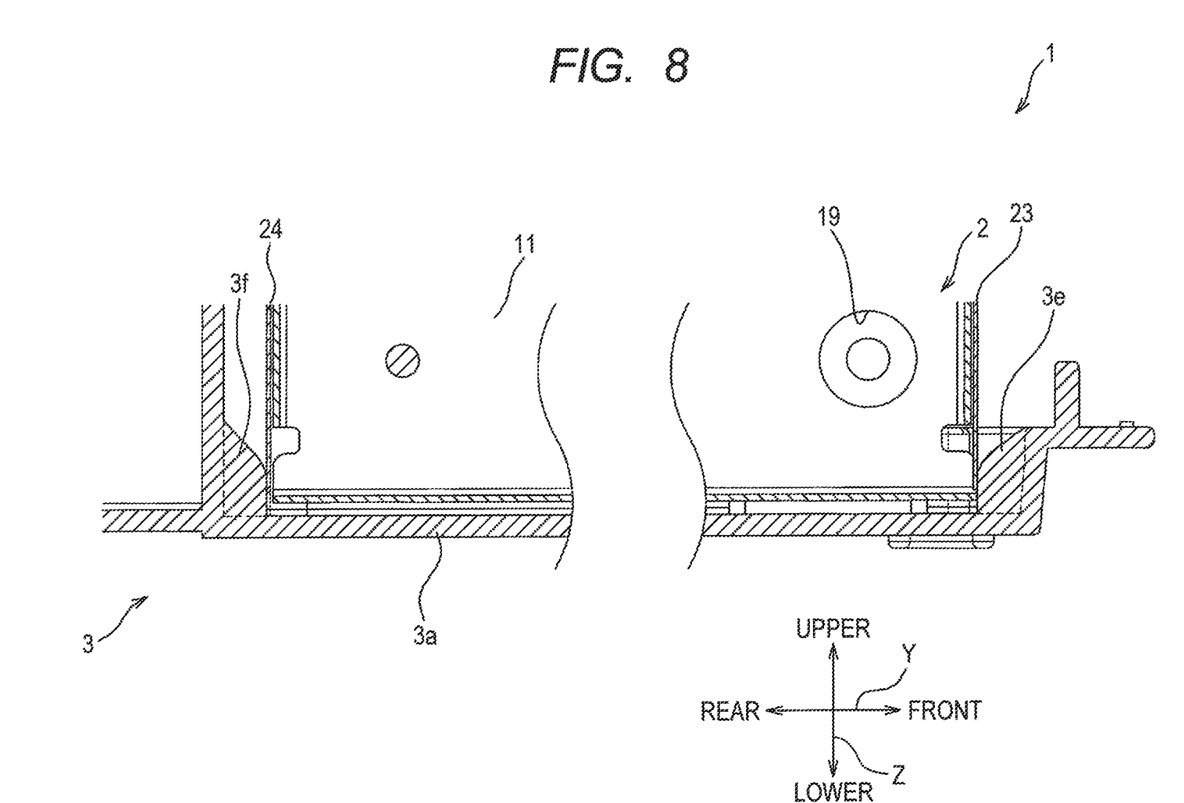
FIG. 8 is a cross-sectional view of relevant parts along a line VIII-VIII shown in FIG. 1.

As shown in FIG. 7, two pressing portions (pressing protrusions) 3e and 3f standing in the vertical direction Z are formed on the bottom plate 3a. As shown in FIG. 8, the pressing portion 3e extends in the front-rear direction Y and an upper surface thereof is an inclined surface that is inclined downward as it advances from the front side toward the rear side. The rear end of the pressing portion 3e is disposed at the lower end of the side plate 23 of the enclosure 2 placed at a particular position of the support tray 3 so that the pressing portion 3e presses a portion near the left end of the side plate 23 toward the rear side. Due to this, it is possible to prevent the occurrence of a gap exceeding particular fireproofing standards between the front end of the main body portion 11 of the sheet metal member 10 and the left end of the side plate 23 of the sheet metal member 20.

As shown in FIG. 8, the pressing portion 3f is disposed at the rear side of the pressing portion 3e. The pressing portions 3e and 3f are arranged to sandwich the enclosure 2 placed at a particular position of the support tray 3. The pressing portion 3f extends in the front-rear direction Y and an upper surface thereof is an inclined surface that is inclined downward as it advances from the rear side toward the front side. The front end of the pressing portion 3f is disposed at the lower end of the side plate 24 of the enclosure 2 placed at a particular position of the support tray 3 so that the pressing portion 3f presses a portion near the left end of the side plate 24 toward the front side. Due to this, it is possible to prevent the occurrence of a gap exceeding particular fireproofing standards between the rear end of the main body portion 11 of the sheet metal member 10 and the left end of the side plate 24 of the sheet metal member 20.

Next, an operation when assembling the power supply unit 1 will be described below. First, the sheet metal member 11 and the power supply circuit board 100 are prepared. Then, the hole portion 15b2 of the vertical portion 15b is inserted into the hole 100c in the front upper portion of the power supply circuit board 100, and the hole portion 17b2 of the vertical portion 17b is inserted into the hole 100d in the rear lower portion of the power supply circuit board 100. At this time, the slit 100f of the power supply circuit board 100 is fitted into the slit 13b1 of the rear portion 13. After that, the screws 8 are fastened into the screw holes 15b1, 16b1, and 17b1 of the vertical portions 15b, 16b, and 17b of the sheet metal member 11 so that the power supply circuit board 100 is fixed to the sheet metal member 10 in an aligned state.

Subsequently, as shown in FIG. 4, after the gap filling member 30 is fixed to the rear portion 13, the sheet metal member 20 is combined with the sheet metal member 10 so that the inner space S for accommodating the power supply circuit board 100 is formed. Then, as shown in FIGS. 2A and 2B, the screw 9 is fastened into the screw hole 18a. In this way, the enclosure 2 is completed.

Subsequently, as shown in FIG. 1, the support tray 3 is prepared, and the enclosure 2 is placed at a particular position of the support tray 3. In this way, the power supply unit 1 is completed.

As described above, according to the enclosure 2 for the power supply circuit board of the present embodiment, since the vertical portions (the circuit board supports) 15b to 17b formed in the inner extensions 15 to 17 of the sheet metal member 10 (the first sheet metal member) face the main body portion 11, it is possible to combine the two sheet metal members 10 and 20 so that a gap (gaps associated with the vertical portions 15b to 17b) exceeding particular fireproofing standards is not formed between the sheet metal member 10 and the sheet metal member 20 (another sheet metal member: the second sheet metal member). Therefore, it is unnecessary to provide a gap filling member for filling a gap, and an increase in the manufacturing cost can be suppressed.

The three inner extensions 15 to 17 are arranged at the ends of the main body portion 11 of the sheet metal member 10 so as to be separated from each other. Due to this, the power supply circuit board 100 can be supported more reliably.

Since the pressing portions 3e and 3f are formed in the support tray 3, such displacement that the side plates 23 and 24 open to the outer side is suppressed when the enclosure 2 is placed on the support tray 3. Therefore, it is possible to prevent the occurrence of a gap exceeding particular fireproofing standards between the sheet metal member 10 (the main body portion 11) and the sheet metal member 20 (the side plates 23 and 24). Since the enclosure 2 is combined with the support tray 3 to form the power supply unit 1, it is unnecessary to provide a gap filling member for filling gaps associated with the vertical portions 15b to 17b, and it is possible to obtain a power supply unit capable of suppressing an increase in the manufacturing cost.

While the disclosure has been described in detail with reference to the above aspects thereof, it would be apparent to those skilled in the art that various changes and modifications may be made therein without departing from the scope of the claims.

For example, in the above-described embodiment, although the sheet metal member 10 includes three inner extensions 15 to 17, the sheet metal member 10 may have one or two or four or more inner extension(s). As long as it is possible to ensure a separation distance between the power supply circuit board 100 and the main body portion 11, or when the power supply circuit board 100 is fixed to the main body portion 11 by a method other than screw-fixing, the concave portion 19 may not be formed in the main body portion 11.

The pressing portion 12c may not be formed in the bottom portion (the bottom plate) 12. A pressing portion capable of pressing the side plate 24 toward the front side may be formed on the rear side of the bottom portion 12 instead of or in addition to the pressing portion 12c. Only one of the two pressing portions 3e and 3f of the support tray 3 may be formed, and the both may be omitted. The two sheet metal members 10 and 20 may not be fixed by the screw 9. In this case, the sheet metal members 10 and 20 may be fixed by another fixing means.

What is claimed is:

1. An enclosure for a power supply circuit board, the enclosure comprising:
a plurality of sheet metal members combined to accommodate a power supply circuit board, the plurality of sheet metal members including a first sheet metal member,
the first sheet metal member including:
a main plate having a flat plate shape;
an inner extension connected to the main plate through a bent portion located at an end of the main plate; and
a bottom plate connected to the main plate through another bent portion located at another end of the main plate, wherein the bottom plate is spaced apart from the inner extension,
the inner extension including a circuit board support for supporting the power supply circuit board, the circuit board support facing the main plate and overlapping the main plate in a direction perpendicular to the main plate, and the circuit board support being separated from the main plate in the direction perpendicular to the main plate, the circuit board support having a first surface facing the main plate and a second surface facing opposite to the main plate, and wherein the power supply circuit board is fixed to the second surface, and wherein the circuit board support is spaced apart from the bottom plate, and the circuit board support is formed from the main plate,
the circuit board support being located within an inner space surrounded by the plurality of sheet metal members.

2. The enclosure according to claim 1, wherein the circuit board support has a screw hole for fixing the power supply circuit board with a screw; and
wherein the main plate of the first sheet metal member includes a concave portion that is concaved at a part facing an entirety of the screw hole.

3. The enclosure according to claim 1, wherein the plurality of sheet metal members further includes a second sheet metal member, the second sheet metal member including:
a facing plate located in parallel with the main plate;
a top plate connected to the facing plate; and
two side plates each connected to the facing plate and the top plate; and
wherein the inner space is formed by combining the first sheet metal member and the second sheet metal member.

4. The enclosure according to claim 3, wherein the bottom plate includes a pressing portion configured to press one of the two side plates from an outer side toward an inner side.

5. The enclosure according to claim 1, wherein the inner extension includes a plurality of inner extensions formed at ends of the main plate and being separated from each other.

6. The enclosure according to claim 1, wherein the first sheet metal member and another sheet metal member are fixed to each other with a screw.

7. The enclosure according to claim 1, wherein the inner extension includes:

a first extension portion bent toward the inner space at a right angle relative to the main plate; and
a second extension portion bent at a right angle relative to the first extension portion so as to face the main plate, the second extension portion serving as the circuit board support.

8. The enclosure according to claim 7, wherein the inner extension further includes:
a reinforcement piece bent at a right angle relative to the second extension portion so as to protrude toward the main plate, the reinforcement piece being for reinforcing the second extension portion.

9. The enclosure according to claim 7, wherein the first extension portion has a size for separating the main plate and the power supply circuit board by a particular distance in a state where the power supply circuit board is fixed to the circuit board support, the particular distance being a shortest separation distance capable of preventing growth of a whisker that causes a short circuit between the power supply circuit board and the main plate.

10. The enclosure according to claim 1, wherein the main plate has a rectangular shape; and
wherein the inner extension is arranged at three corners of the rectangular shape of the main plate.

11. The enclosure according to claim 1, wherein the circuit board support has a screw hole for fixing the power supply circuit board with a screw; and
wherein the screw hole protrudes toward the inner space from the circuit board support such that a position of an internal thread of the screw hole is farther away from the main plate.

12. A power supply unit comprising:
an enclosure for a power supply circuit board; and
a support tray,
the enclosure comprising a first sheet metal member and a second sheet metal member combined to form an inner space accommodating a power supply circuit board,
the first sheet metal member including:
a main plate having a flat plate shape;
an inner extension connected to the main plate through a bent portion located at an end of the main plate, the inner extension including a circuit board support for supporting the power supply circuit board, the circuit board support facing the main plate and overlapping the main plate in a direction perpendicular to the main plate, and the circuit board support being separated from the main plate in the direction perpendicular to the main plate, the circuit board support having a first surface facing the main plate and a second surface facing opposite to the main plate, and wherein the power supply circuit board is fixed to the second surface, the circuit board support being located within the inner space formed by the first sheet metal member and the second sheet metal member, and the circuit board support is formed from the main plate; and
a bottom plate connected to the main plate through another bent portion located at another end of the main plate, wherein the circuit board support is spaced apart from the bottom plate, wherein the bottom plate is spaced apart from the inner extension,
the second sheet metal member including:
a facing plate located in parallel with the main plate;
a top plate connected to the facing plate; and two side plates each connected to the facing plate and the top plate, the support tray supporting the enclosure in a state where the support tray is in contact with the bottom plate, the support tray including a pressing portion configured to press at least one of the two side plates from an outer side toward an inner side.

13. The power supply unit according to claim 12, wherein the support tray includes two pressing portions arranged to sandwich the enclosure placed at a particular position on the support tray;

wherein each of the two pressing portions has an upper surface that is inclined downward from the outer side toward the inner side; and wherein the two pressing portions are configured to press the two side plates of the enclosure placed at the particular position from the outer side toward the inner side.

* * * * *